US006478843B1

(12) United States Patent
Wittdorf et al.

(10) Patent No.: US 6,478,843 B1
(45) Date of Patent: Nov. 12, 2002

(54) ANTI-ADHERENT COATING AND METHOD FOR THE PRODUCTION THEREOF

(75) Inventors: Ralf Wittdorf; Jochen Brand, both of Braunschweig (DE)

(73) Assignee: Fraunhofer-Gesellschaft zur Foerderung der Angewandten Forschung e.V, Munich (DE)

( * ) Notice: Subject to any disclaimer, the term of this patent is extended or adjusted under 35 U.S.C. 154(b) by 0 days.

(21) Appl. No.: 09/700,738

(22) PCT Filed: May 17, 1999

(86) PCT No.: PCT/EP99/03381

§ 371 (c)(1),
(2), (4) Date: Jan. 4, 2001

(87) PCT Pub. No.: WO99/60183

PCT Pub. Date: Nov. 25, 1999

(30) Foreign Application Priority Data

May 18, 1998 (DE) .......................................... 199 22 273

(51) Int. Cl.[7] .......................... C23C 14/04; C23C 16/26; B23K 35/22; H01H 1/02
(52) U.S. Cl. .......................... 75/302; 219/119; 219/129; 219/145.41; 219/146.21; 219/649; 228/51; 228/101; 228/262.9; 428/336; 428/408

(58) Field of Search ................................. 428/408, 469, 428/336; 427/245; 75/302; 228/51, 101, 262.9; 219/119, 145.41, 129, 649, 146.21

(56) References Cited

U.S. PATENT DOCUMENTS 5,100,701 A    3/1992  Freller et al. ............... 428/215
5,728,465 A  * 3/1998  Dorfman et al.
5,771,873 A  * 6/1998  Potter et al.

FOREIGN PATENT DOCUMENTS

| DE | 44 17 235 | 11/1994 |
| GB | 2 269 105 | 2/1994 |
| JP | 5-228623 | 9/1993 |
| WO | WO 94/12680 | 6/1994 |

OTHER PUBLICATIONS

Martino et al., "Improvement of mechanical properties of a–C:H by silicon addition", Diamonds and Related Materials 6 (1997) 559–563, No Month.

* cited by examiner

Primary Examiner—Archene Turner
(74) Attorney, Agent, or Firm—Crowell & Moring LLP

(57) ABSTRACT

An anti-adhesion coating for welding and/or soldering devices and electric contacts for reducing the adhesion of metallic contaminations on their surfaces includes a diamond-like carbon layer.

41 Claims, No Drawings

ANTI-ADHERENT COATING AND METHOD FOR THE PRODUCTION THEREOF

BACKGROUND AND SUMMARY OF THE INVENTION

The invention relates to an anti-adhesion coating for welding and soldering devices as well as electric contacts and to a process for manufacturing same. A preferred field of application is the protection of holding, guiding and fixing devices of welding and/or soldering devices, particularly of automated welding lines in automobile construction.

U.S. Pat. No. 4,156,807 suggests applying a boron nitride layer for protecting a workpiece from metallic contaminations in the form of hot welding spatters or welding beads. Boron nitride is very resistant to temperature changes and therefore prevents thermally caused damage to the workpiece by hot metallic contamination. However, boron nitride is relatively soft, so that, depending on the application condition of the workpiece to be machined, the layer may suffer mechanical damage and the protective effect may therefore be lost. Furthermore, boron nitride is a good electric insulator whose insulation characteristic is undesirable, for example, when electric contacts are to be protected. Another considerable disadvantage is the only moderate anti-adhesion effect of boron nitride with respect to metallic contaminations.

German Patent Document DE 41 10 539 A1 teaches the protection of a highly copper-containing component against microscopic or macroscopic contaminations, such as flue gases or splatters of liquid metal, by a protective layer of titanium nitride or titanium carbonitride. Because the electrical properties of the components of German Patent document DE 41 10 539 A1 are to be changed as little as possible, these titanium-based hard materials are very suitable because of their high temperature stability and their good electrical conductivity. As in the case of boron nitride, their only moderate anti-adhesion effect with respect to metallic contaminations is disadvantageous. Furthermore, they have the disadvantage that these protective layers can be deposited during PVD and CVD process at typically relatively high temperatures of more than 450° C. Such protective layers on a titanium basis can therefore not be used or can be used only to a limited degree in the case temperature-susceptible substrates. Furthermore, the good electrical conductivity of the anti-adhesion coating may be undesirable depending on the application.

When protecting surfaces against metallic contamination, such as contaminations of welding processes, as in the above-mentioned patent documents, in addition to the thermal protection of the surface, it is also important that the metallic contaminations do not adhere to the surface. Adhering metallic contaminations may result in mechanical as well electric malfunctioning.

For welding and hard soldering purposes, guiding, fixing and clamping devices made of steel and materials for casting are frequently used which, with respect to metallic contaminations, because of similarly high values in the total surface energy $\sigma^{tot}$, have a strong tendency to adhere. Adhering metallic contaminations result in an inaccuracy of measurements of the above-mentioned devices, which therefore must be frequently exchanged or reworked. Such problems occur, for example, in automated welding lines, for example, in automobile construction or during the manufacturing of pipes.

In addition, there are electrical components, such as tips of contacts, contact springs or contact terminals, which are provided in the electrical industry for testing the performance of electronic components and which frequently come in contact with soft solders. Because of the low solder temperatures of initially maximally 450° C., the providing of a thermally stable protection layer is therefore not as required as the providing of a protective layer which prevents the adhering of the spread-on soft, usually tin or lead-containing solder. However, adhering metallic solder uncontrollably affects the electric contact, which results in electrical malfunctioning. Such contacts frequently consist of nonferrous metal alloys and, for the above-mentioned reasons, are often protected by galvanic layers with Cr, Ni, Ag, Au. Although these layers have the required electrical conductivity, they are quite soft and are rapidly abraded.

It is an object of the invention to largely avoid the problems of the prior art and to provide an alternative for the above-mentioned protective layers against metallic contaminations from welding and soldering processes. This alternative protective layer is to be thermally stable and is to have particularly good anti-adhesion characteristics with respect to the usually ductile metallic contaminations. The anti-adhesion effect is to exist particularly with respect to the normally used materials of the welding and soldering systems, that is, predominantly with respect to steel and diecast material.

Another object consists of providing a hard protective layer with good wear and friction properties in order to be mechanically usable in a manner which is as universal as possible.

Another object is the providing of an anti-adhesion layer which can be varied in its electrical conductivity so that it can be used as universally as possible with respect to its electrical behavior.

Another object consists of providing an anti-adhesion layer against metallic contaminations which, when it is applied to the workpiece or component to be protected, if possible, does not damage the workpiece or component.

According to the invention, these objects can be achieved by an anti-adhesion coating according to the present invention. Advantageous further developments of the anti-adhesion coating according to the invention are indicated in the dependent claims. The process for manufacturing these coatings takes place according to the present invention.

DETAILED DESCRIPTION OF THE INVENTION

The coatings according to the invention are made of a diamond-like carbon for preventing the adhering of metallic contaminations of welding and/or soldering processes on a surface and are very hard, temperature-stable, adhesion-inhibiting, exhibit a very good wear behavior and a favorable friction behavior. These coatings can be deposited easily and cost-effectively particularly by vapor deposition, and specifically by the PVD or the CVD process. As a result, the deposition can also take place on curved surfaces with a complicated surface geometry. Also a partial coating of the welding or soldering device is conceivable. A partial coating may consist of the fact that at least the surface areas exposed to the metallic contaminations are coated. These are particularly the guides as well as fixing and holding devices for the components to be joined, but also welding dies and welding nozzles.

Amorphous hydrocarbon layers (a-C:H), hydrogen-free amorphous hydrocarbon layers (a:C), and silicon-containing hydrocarbon layers (Si:C—H) are particularly advantageous in the sense of the present invention. The latter layers have particularly good anti-adhesion properties which are close to those of TEFLON®.

Our own research revealed that the problem of the adhesion of metallic contaminations is less critical in the case of already cooled and largely brittle contaminations. These adhere relatively weakly to the mostly metallic surface of welding and soldering devices. In contrast, the considerable adhering of the contaminations which are not yet cold when they impact on the surface and are therefore still ductile presents a problem. As a result of the anti-adhesion coatings according to the invention, the adhering of metallic contaminations of welding a soldering processes can clearly be reduced on the welding and/or soldering devices which usually consist of steel or a diecast material. This applies particularly to ductile metallic contamination, such as welding beads, welding splatters, hard and soft solder droplets. The resulting service life, within which the contaminated components must be exchanged, reworked or cleaned, can be increased. The stoppage and the exchange periods can therefore be reduced.

The inaccuracy of measurements occurring particularly in automated welding lines, as in automobile construction or the manufacturing of pipes, as the result of contaminations of the components, as for example, guides, fixing and holding devices, can be avoided. Positioning errors during the welding can therefore be prevented and the occurrence of rejects can be minimized.

Electric contacts, such a contact pins or contact springs in the electric industry, can be effectively protected against adhesions of hard or soft solder by means of the anti-adhesion coatings according to the invention. Thus, functional disturbances during the testing of electronic components can be avoided. In addition, by the selection of a metal-containing carbon coating (Me—C:H-coating), a good electrical contact can be ensured. As a result of the composition and the increase of the metal content, which is preferably between 10% and 49.9%, the electric conductivity of the coating can be increased and can be optimized with respect to the respective application. The metals, which are used, are preferably metals from secondary groups of the Periodic System of Elements, such as W, Zr, Cr, Au, Ag, Pt, Cu, Ta, Hf and V, but also Ti.

Very good anti-adhesion properties are achieved particularly when the layer thickness is between 0.2 $\mu$m to 15 $\mu$m.

What is claimed is:

1. A metallic contamination resistant electric contact, comprising:
    an anti-adhesion coating on a surface of said electric contact;
    wherein said anti-adhesion coating is a diamond-like carbon layer.

2. The metallic contamination resistant electric contact according to claim 1, wherein the carbon layer comprises at least one of hydrogen-free amorphous hydrocarbon; amorphous hydrocarbon; silicon-containing hydrocarbon; and metal-containing carbon.

3. The metallic contamination resistant electric contact according to claim 2, wherein the carbon layer is a layer of metal-containing carbon, and the metal is selected from the group consisting of W, Zr, Cr, Au, Ag, Pt, Cu, Ta, Hf, V, and Ti.

4. The metallic contamination resistant electric contact according to claim 3, wherein the metal content is between 10% and 49.9%.

5. The metallic contamination resistant electric contact according to claim 1, wherein the carbon layer has a thickness of between 0.2 $\mu$m and 15 $\mu$m.

6. The metallic contamination resistant electric contact according to claim 1, wherein the carbon layer is deposited by vapor deposition.

7. The metallic contamination resistant electric contact according to claim 1, wherein the carbon layer is deposited by plasma vapor deposition.

8. The metallic contamination resistant electric contact according to claim 1, wherein the carbon layer is deposited by chemical vapor deposition.

9. A metallic contamination resistant welding device, comprising:
    an anti-adhesion coating on a surface of said welding device;
    wherein said anti-adhesion coating is a diamond-like carbon layer.

10. The metallic contamination resistant welding device according to claim 9, wherein the carbon layer comprises at least one of hydrogen-free amorphous hydrocarbon; amorphous hydrocarbon; silicon-containing hydrocarbon; and metal-containing carbon.

11. The metallic contamination resistant welding device according to claim 10, wherein the carbon layer is a layer of metal-containing carbon, and the metal is selected from the group consisting of W, Zr, Cr, Au, Ag, Pt, Cu, Ta, Hf, V, and Ti.

12. The metallic contamination resistant welding device according to claim 11, wherein the metal content is between 10% and 49.9%.

13. The metallic contamination resistant welding device according to claim 9, wherein the carbon layer has a thickness of between 0.2 $\mu$m and 15 $\mu$m.

14. The metallic contamination resistant welding device according to claim 9, wherein the carbon layer is deposited by vapor deposition.

15. The metallic contamination resistant welding device according to claim 9, wherein the carbon layer is deposited by plasma vapor deposition.

16. The metallic contamination resistant welding device according to claim 9, wherein the carbon layer is deposited by chemical vapor deposition.

17. A metallic contamination resistant soldering device, comprising:
    an anti-adhesion coating on a surface of said soldering device;
    wherein said anti-adhesion coating is a diamond-like carbon layer.

18. The metallic contamination resistant soldering device according to claim 17, wherein the carbon layer comprises at least one of hydrogen-free amorphous hydrocarbon; amorphous hydrocarbon; silicon-containing hydrocarbon; and metal-containing carbon.

19. The metallic contamination resistant soldering device according to claim 18, wherein the carbon layer is a layer of metal-containing carbon, and the metal is selected from the group consisting of W, Zr, Cr, Au, Ag, Pt, Cu, Ta, Hf, V, and Ti.

20. The metallic contamination resistant soldering device according to claim 19, wherein the metal content is between 10% and 49.9%.

21. The metallic contamination resistant soldering device according to claim 17, wherein the carbon layer has a thickness of between 0.2 $\mu$m and 15 $\mu$m.

22. The metallic contamination resistant soldering device according to claim 17, wherein the carbon layer is deposited by vapor deposition.

23. The metallic contamination resistant soldering device according to claim 17, wherein the carbon layer is deposited by plasma vapor deposition.

24. The metallic contamination resistant soldering device according to claim 17, wherein the carbon layer is deposited by chemical vapor deposition.

25. A process for preventing adhesion of metallic contaminations on a surface of an electric contact comprising depositing a diamond-like carbon layer on the surface of the electric contact.

26. The process according to claim 25, wherein the electric contact is a contact pin, a contact spring, or a contact terminal.

27. The process according to claim 25, wherein the depositing is by chemical vapor deposition or plasma vapor deposition.

28. The process according to claim 25, wherein the carbon layer comprises at least one hydrogen-free amorphous hydrocarbon; amorphous hydrocarbon; silicon-containing hydrocarbon; and metal-containing carbon.

29. The process according to claim 28, wherein the carbon layer is a metal-containing carbon layer and the metal content is between 10% and 49.9%.

30. The process according to claim 29, wherein the metal contains an element selected from the group consisting of W, Zr, Cr, Au, Ag, Pt, Cu, Ta, Hf, V, and Ti.

31. A process for preventing adhesion of metallic contaminations on a surface of a welding device or a soldering device comprising depositing a diamond-like carbon layer on the surface of the welding device or the soldering device.

32. The process according to claim 31, wherein the welding device is a welding die or a welding nozzle.

33. The process according to claim 31, wherein the depositing is by chemical vapor deposition or plasma vapor deposition.

34. The process according to claim 31, wherein the carbon layer comprises at least one hydrogen-free amorphous hydrocarbon; amorphous hydrocarbon; silicon-containing hydrocarbon; and metal-containing carbon.

35. The process according to claim 34, wherein the carbon layer is a metal-containing carbon layer and the metal content is between 10% and 49.9%.

36. The process according to claim 35, wherein the metal contains an element selected from the group consisting of W, Zr, Cr, Au, Ag, Pt, Cu, Ta, Hf, V, and Ti.

37. A process for protecting fixing, guiding and holding devices of a welding system or a soldering system comprising depositing a diamond-like carbon layer on a surface of the fixing, guiding, or holding devices.

38. The process according to claim 37, wherein the depositing is by chemical vapor deposition or plasma vapor deposition.

39. The process according to claim 37, wherein the carbon layer comprises at least one hydrogen-free amorphous hydrocarbon; amorphous hydrocarbon; silicon-containing hydrocarbon; and metal-containing carbon.

40. The process according to claim 39, wherein the carbon layer is a metal-containing carbon layer and the metal content is between 10% and 49.9%.

41. The process according to claim 40, wherein the metal contains an element selected from the group consisting of W, Zr, Cr, Au, Ag, Pt, Cu, Ta, Hf, V, and Ti.

* * * * *